United States Patent
Liu et al.

(10) Patent No.: US 9,851,390 B2
(45) Date of Patent: Dec. 26, 2017

(54) METHOD FOR LOCATING DISTRIBUTION NETWORK CIRCUIT FAULT BASED ON FULL WAVEFORM INFORMATION

(71) Applicant: Shanghai Jiao Tong University, Shanghai (CN)

(72) Inventors: Yadong Liu, Shanghai (CN); Gehao Sheng, Shanghai (CN); Jiejie Dai, Shanghai (CN); Jiamei Liu, Shanghai (CN); Yun Hu, Shanghai (CN); Xiaolei Xie, Shanghai (CN); Yong Qian, Shanghai (CN); Yue Hu, Shanghai (CN); Xiuchen Jiang, Shanghai (CN)

(73) Assignee: SHANGHAI JIAO TONG UNIVERSITY, Shanghai (CN)

( * ) Notice: Subject to any disclaimer, the term of this patent is extended or adjusted under 35 U.S.C. 154(b) by 504 days.

(21) Appl. No.: 14/530,627

(22) Filed: Oct. 31, 2014

(65) Prior Publication Data

US 2016/0061873 A1    Mar. 3, 2016

(30) Foreign Application Priority Data

Aug. 29, 2014   (CN) .......................... 2014 1 0437624

(51) Int. Cl.
| | |
|---|---|
| *G01R 31/00* | (2006.01) |
| *G01R 31/02* | (2006.01) |
| *G01R 31/08* | (2006.01) |
| *H02H 7/26* | (2006.01) |
| *H02H 7/28* | (2006.01) |

(52) U.S. Cl.
CPC ......... *G01R 31/025* (2013.01); *G01R 31/088* (2013.01); *H02H 7/261* (2013.01); *H02H 7/28* (2013.01)

(58) Field of Classification Search
CPC   G01R 19/2513; G01R 31/086; G01R 31/025; Y04S 20/52; H04L 67/12; H02J 2003/007
See application file for complete search history.

(56) References Cited

U.S. PATENT DOCUMENTS

| | | | | |
|---|---|---|---|---|
| 4,878,142 A | * | 10/1989 | Bergman | G01R 31/025 324/522 |
| 6,721,671 B2 | * | 4/2004 | Roberts | G01R 31/025 324/509 |
| 8,525,522 B2 | * | 9/2013 | Gong | G01R 31/086 324/519 |

* cited by examiner

*Primary Examiner* — Elias Desta
(74) *Attorney, Agent, or Firm* — Mei & Mark LLP; Manni Li

(57) ABSTRACT

A method for detecting and locating faulty line on the distribution network circuit based on full waveform information, which uses the current data on the fault occurrence and whole-process operation of the compensation device to effectively solve such common problems as low fault current, poor reliability and low sensitivity in case of single-phase grounding fault to the low-current system through precise GPS synchronization. It improves the sensitivity and reliability of the grounding fault detection, which does not interfere with the system and is applicable to high-resistance grounding.

14 Claims, 5 Drawing Sheets

METHOD FOR LOCATING DISTRIBUTION NETWORK CIRCUIT FAULT BASED ON FULL WAVEFORM INFORMATION

CROSS-REFERENCE AND RELATED APPLICATIONS

The subject application claims priority on Chinese patent application No. CN 201410437624.X filed on Aug. 29, 2014. The contents and subject matter of the Chinese priority application is incorporated herein by reference.

FIELD OF THE INVENTION

The present invention relates to a method for diagnosing faulty line on the electrical power distribution network, particularly, the method is based on full waveform information for locating the circuit fault on the distribution network.

BACKGROUND OF THE INVENTION

During the operation of the electrical power system, power failure due to the distribution network faults statistically accounts for over 95% of the total accidents, and 70% of the accidents are caused by single-phase grounding faults or busbar faults. To avoid power failure when the single-phase grounding fault occurs, non-effective grounding (low-current grounding) mode at the neutral points of the external distribution network has been extensively used worldwide. The faulty line and location of the single-phase grounding fault on the distribution network has been difficult to detect, as the characteristics of the fault is weak. As the distribution network grows more automated, the fundamental need to solve the problem of locating the distribution network fault grows higher.

The current fault detection methods are generally divided into two categories, namely, the signal injection method and the section location method based on the faulty feature vector. The signal injection method includes "S" injection method, AC/DC injection method, and resistance in parallel method; the methods may impose high interference to the system and can't detect instantaneous and intermittent grounding faults. The section location method based on the faulty feature vector includes a zero-module current comparison method, section zero sequence admittance method, zero-sequence reaction power direction method, location method based on sudden difference of the phase current, residual increment method, and travel wave method; the methods have the disadvantages of difficulty to obtain the feature vector and precise synchronization of signals. Furthermore, some methods are not reliable when a high resistance is grounded.

SUMMARY OF THE INVENTION

To overcome the disadvantages of the current technology, the present invention provides a full wave information based method for detecting and locating circuit faults on the distribution power network. Based on the principle of "line selection first, location next" and taking into consideration the compatibility of the location method to inter-phase faults, the method of the present invention fully utilizes the waveform information on various detection points before and after the action of the arc suppression device (or relay protection device). The neutral-point voltage undergoes two-stage changes during the period from the occurrence of the accident to the output of the stable compensation current by any arc suppression coil: at the first stage (time period defined as $T_1$), the arc suppression device fails to work after the fault occurs, while the zero-sequence voltage has a sudden change and is in negative correlation with the fault resistance, and the stage may last for over 2 cycles of waves; at the second stage (time period defined as $T_2$), the arc suppression device starts to work to output compensation current, while the zero-sequence voltage has another sudden change and the amount after the change is close to the phase voltage (maximum value is reached in case of full compensation).

The present invention is based on the following principles:

It's based on the action features of the auto tracking compensation suppression device currently widely applied to the distribution network. So far, the arc suppression coil has been widely applied to the distribution network for compensating the capacitive current passing through the fault point in case of the single-phase grounding of the non-effective grounding system and preventing arc overvoltage. The auto tracking compensation arc suppression device has been popularized in China since 1990's. It may include those having capacity adjustment, manual shift, Ac magnetic bias, and air gap adjustment types according to the reactance adjustment method, or the preliminary adjustment and random adjustment types according to the operation mode. The preliminary adjustment type aims at measuring capacitive current of the system when no fault is discovered and adjusting the arc suppression coil to the position approximate to full compensation; in the mode, the coil is in serial connection with a damped resistor to prevent series resonance overvoltage when the system is in normal operation. The device will be in short connection with the damped resistor momentarily when the device detects a single-phase grounding fault, and is recovered with the damped resistor once the fault is eliminated. The random adjustment type has an arc suppression coil that is in operation at the position far from the resonance position when the system is free of any fault while real-time monitoring the capacitive current of the system. When a single-phase grounding fault is detected, the arc suppression coil is adjusted to the position approximate to full compensation, while is adjusted to the position far away from the resonance point once the fault is eliminated. The random adjustment type may prevent series resonance when the system is in normal operation without the need to install a damped resistor.

The action time limit of the arc suppression coil $t_L$ refers to the time from the occurrence of a single-phase grounding fault to the output of the induction current by the arc suppression coil, as expressed in the following formula:

$$t_L = t_{det} + t_{act} \tag{1}$$

In the formula, $t_{det}$ refers to the time of grounding fault as detected by the arc suppression device; $t_{act}$ refers to the action time of the execution mechanism. Normally, the overvoltage to the neutral point or over-current to the arc suppression coil is used by the device for grounding detection, and it takes at least 1-2 cycles for the detection of the grounding fault. The action time of the execution mechanism is associated with the operation mode of the arc suppression device: the action time of the preset arc suppression coil is the short connection time of the damped resistor, which can be up to 10 μs. However, in view of the fact that the damped resistor can shorten the transient transition time of the compensation current and accelerate the response of the arc suppression coil, the short connection of the damped resistor is normally delayed according to the DC component of the output current after the occurrence of the grounding, and the arc suppression coil of the random adjustment type quickly regulates the compensation after the occurrence of a fault while the response speed is over 60 ms. Thus, it takes 2-5 cycles from the occurrence of a fault to the input of the arc suppression coil.

Based on the analysis of the operation characteristics of the arc suppression apparatus and the effect of the operation process on the zero-sequence voltage and zero-sequence current of a single-phase grounding fault on the distribution network, the present invention uses the current data as obtained after the occurrence of the fault and during the complete operation of the compensation device to propose a full waveform information based method for locating the fault on distribution network circuit through the precise GPS synchronization. The method of the present invention not only improves the sensitivity and reliability of the grounding fault location but also is applicable to high-resistance grounding.

The present invention provides a full waveform information based method for locating distribution network circuit fault comprising the following 3 steps:

Step 1 (S1): the three-phase current and zero-sequence voltage of the busbar are measured, the fault type is judged, and the phase and time of the fault is determined after the occurrence of a fault;

Step 2 (S2): If the fault is determined to be an inter-phase fault, the three-phase current to the initial end of each line during the period from the fault detection to the action of the relay protection device is measured, and the faulty line is selected;

if the fault is determined to be a grounding fault, the zero-sequence current and zero-sequence voltage to the initial end of each line during the period from the fault detection to the action of the arc suppression coil are measured, and the faulty line is selected;

Step 3 (S3): If the fault is determined to be an inter-phase fault, and the faulty line is selected, the fault-phase current at each measurement point of the faulty line is measured for detecting and locating the faulty section;

if the fault is determined to be a grounding fault, and the faulty line is selected, the zero-sequence current to each measurement point of the faulty line is measured for detecting and locating the faulty section.

Step 1 (S1) is performed as follows: the fault type and time are judged according to the three-phase current and zero-sequence voltage of the busbar. If there is an over-current, then, the fault is an inter-phase fault and an over-current phase (fault phase) is found; if there is an increase in the zero-sequence voltage, then, the fault is a grounding fault. The moment that the sudden change in the phase current or zero-sequence voltage is recorded is defined as the faulty moment.

Step (S2) is performed as follows:

if a grounding fault is judged at Step 1 (S1): with regard to non-fault line, $\dot{I}_{i0}$ is the zero-sequence current between time interval $T_1$ and $T_2$ of the initial end of line i that satisfies the following formula:

$$\dot{I}_{i0} = j\omega C_{i\Phi} \dot{U}_{N0} \quad (2)$$

Apparently, the zero-sequence voltage leads the corresponding zero-sequence current at 90° in theory. With regard to the faulty line (the line is assumed as n), its zero-sequence current is equal to the sum of vectors of the line capacitive current and residual faulty current, namely, $$\dot{I}_{n0} = j\omega C_{n\Phi} \dot{U}_{N0} + \dot{I}_k \quad (3)$$

At the time interval of T1, the compensation effect of the arc suppression coil may be neglected due to the lower zero-sequence voltage and higher resistance of the arc suppression coil. According to the following formula $$\dot{I}_k = \dot{I}_L - \dot{I}_{C\Sigma} = \frac{\dot{U}_0}{j\omega L} - \dot{I}_{C\Sigma} \quad (4)$$

Thus, the residual current at the grounding point mainly comprises the capacitive current of the whole system, and Formula (3) may be simplified as follows:

$$\dot{I}_{n0} = j\omega C_{n\Phi} \dot{U}_{N0} - \dot{I}_{C\Sigma} \quad (5)$$
$$= -j\omega \dot{U}_{N0}(C_{\Sigma\Phi} - C_{n\Phi})$$

Thus, theoretically, the zero-sequence voltage at this time interval is lagged by the zero-sequence current on the faulty line by 90°. The phase of the zero-sequence current at the time interval T2 is associated with the compensation of the arc suppression coil, which is free of definitive phase relation. Therefore, the faulty line may be selected based on the sampling sequence of the zero-sequence voltage and zero-sequence current at the time interval T1. The phase difference is indicated with the maximum value of the cross correlation function corresponding to the sequence suffix. If first cycle sampling point for the power frequency is N, the sampling sequence of the zero-sequence voltage and zero-sequence current are $I_0(n)$ and $U_0(n)$, then, the cross correlation function is defined as follows:

$$R_{ui}(m) = \sum_{i=0}^{N-m-1} I_0(i) U_0(i+m) \quad (6)$$

R(m) reflects the similarity of the zero-sequence voltage and zero-sequence current at different relative positions. The range of the self-variable m is an integer being 0, 1, . . . up to N−1, while N is the frequency of the sampling. The maximum value of the cross correlation function at [0,N] is calculated; τ refers to the suffix corresponding to the maximum value, namely, $R_{ui}(m)_{max} = R_{ui}(\tau)$. According to the properties of the cross correlation function, τ refers to the time delay of $I_0(n)$ with regard to $U_0(n)$.

The method of the present invention for judging the faulty line is as follows: collecting the zero-sequence voltage and zero-sequence current at the initial end of each line within 1 cycle (0.02s) after the occurrence of the fault to calculate the cross correlation function and the maximum value of the two; if τ, the suffix of the maximum value as calculated is between 0 and N/2, it indicates that the zero-sequence current is ahead of the zero-sequence voltage, and the line is a non-faulty line; if τ is between N/2 and N, it indicates that the zero-sequence current lags behind the zero-sequence voltage, and the line is a faulty line; if all lines are free of any faults, it points out to the busbar fault. Here, N=0.02*fs, while fs refers to the sampling frequency of the device.

If an inter-phase fault is judged at Step 1 (S1), the faulty line is judged as follows: collecting the faulty phase current at the initial ends of each line during the period from the occurrence of the fault to the action of the relay protection device; if the valid value of the current exceeds the preset over-current threshold value, it indicates that the line is faulty; otherwise, the line is non-faulty.

Step 3 (S3) is performed as follows: if a grounding fault is judged at Step 1 (S1), with regard to the downstream of the faulty point, the zero-sequence current is actually the grounding capacitive current to the line at the detection point, of which value and phase directly correlate with the zero-sequence voltage, i.e., the zero-sequence current at the time interval T2 is increased if the zero-sequence current occurs to the time interval T1. With regard to the upstream of the faulty point of the faulty line, the compensation effect of the arc suppression coil may be neglected due to the lower zero-sequence voltage and higher resistance of arc suppression coil at time interval T2; the zero-sequence current mainly comprises the sum of the capacitive current of the non-fault elements of the system of higher amplitude, whose phase is opposite to that of the downstream; the amplitude drastically decreases while the capacitive current is compensated at the time interval T2. Thus, if close zero-sequence voltages at adjacent detection points are deemed to be equal, the changing characteristics of the upstream and downstream zero-sequence currents are inconsistent, which is reflected by the significant discrepancy in the zero-sequence current at the detection points on both ends of the faulty area. As the differential zero-sequence current value at he detection points on both ends of the non-faulty area only represents the grounding capacitive current in the area, the two currents are quite alike. Therefore, the faulty section may be determined based on the similarity in the waveform of the whole-process zero-sequence current on both ends of the section after the occurrence of the fault.

The standard deviation is defined as follows:

$$d_{p.u.} = \left[ \frac{\sum_{n=1}^{M} [i_{01}(n) - i_{02}(n)]^2}{\min\left\{\sum_{n=1}^{M} i_{01}(n)^2, \sum_{n=1}^{M} i_{02}(n)^2\right\}} \right]^{\frac{1}{2}} \quad (7)$$

As an indicator for judging the waveform similarity, $i_{01}(n)$ and $i_{02}(n)$ represent the sequences of the zero-sequence currents as collected at two adjacent detection points; n and M represent the sampling sequence and data length respectively, which are affected by the selected length of the time window and usually about 2 cycles.

Based on the above analysis, the standard deviation to waveform on both ends of the non-faulty area is approximate to 0, thus, the standard deviation at the faulty section is an integer above 0.

If an inter-phase fault is judged at Step 1 (S1):

the time window data for the faulty phase current at two adjacent detection points are selected during 2 power frequency cycles after the occurrence of the fault to calculate $d_{p.u.}$, the standard deviation. Similarly, the section is a non-faulty section, if $d_{p.u.}$ is over the preset threshold value, and vice versa.

In case a relatively high transition resistance is incurred by the grounding fault so as to reduce the reliability of the data, the length of the time window is maintained while 1 cycle is taken on the time axis as the step length and the $d_{p.u.}$ is calculated repeatedly for 3-5 times to make full use of the data at the time intervals $T_1$ and $T_2$ to ensure accurate conclusion.

The above location method is only applicable to adjacent detection points free of branches. If the faulty line as selected has branches, then, the faulty location on the trunk line must be firstly determined. If the faulty point is not detected on the trunk line, then, the faulty line on the branches must be selected by line selection algorithm and then locate the specific faulty section by applying the location algorithm.

The present invention is advantageously based on the analysis of the operation features of the arc suppression device and the impact of its operation on the zero-sequence voltage and zero-sequence current as incurred by the single-phase grounding fault on the distribution network compared to the current technology. The method of the present invention uses the current data from the fault occurrence and the complete operation process of the compensation device, and with the aid of precise GPS synchronization, to effectively solve common problems such as low fault current, poor reliability, and low sensitivity in case of a single-phase grounding fault. The present invention improves the sensitivity and reliability of the grounding fault location detection, does not interference with the system, and is equally applicable to high-resistance grounding.

DETAILED DESCRIPTION OF THE INVENTION AND PREFERRED EMBODIMENTS

Figure 1:
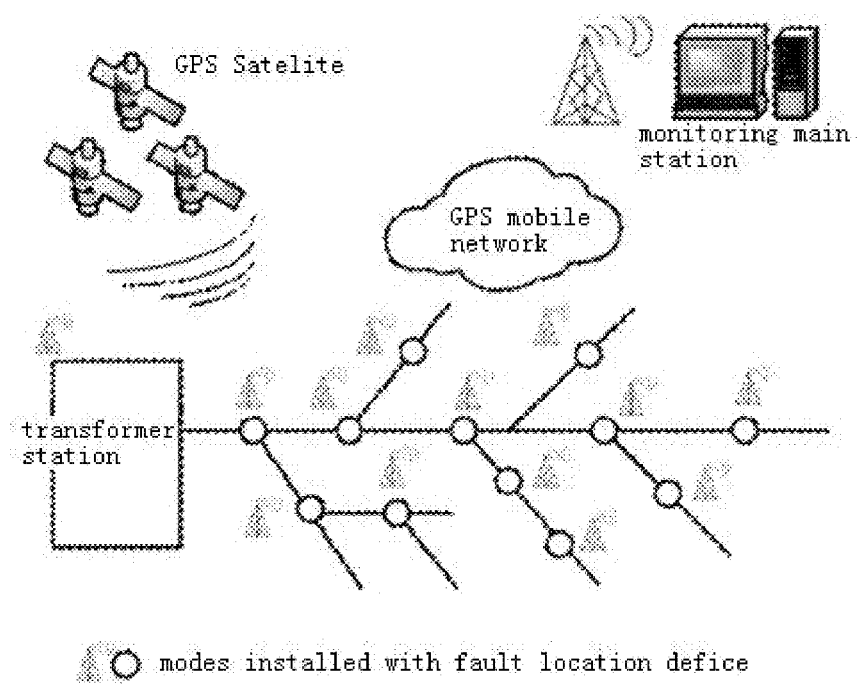
FIG. 1 shows the structure of the system for locating the faulty section on the distribution network.

The faulty waveform used in the present invention is provided by the distribution fault location system. The structure of the system is shown in FIG. 1. The system for locating the faulty section on the distribution network comprises a main monitoring station, a measuring device of the transformer station (busbar), and location devices for faulty nodes installed at various sections along the distribution line. The line is topologically divided by the fault location nodes into numerous sections, and each node is installed with three measuring devices for real-time synchronized collection of the three-phase current and voltage on the line.

Figure 2:
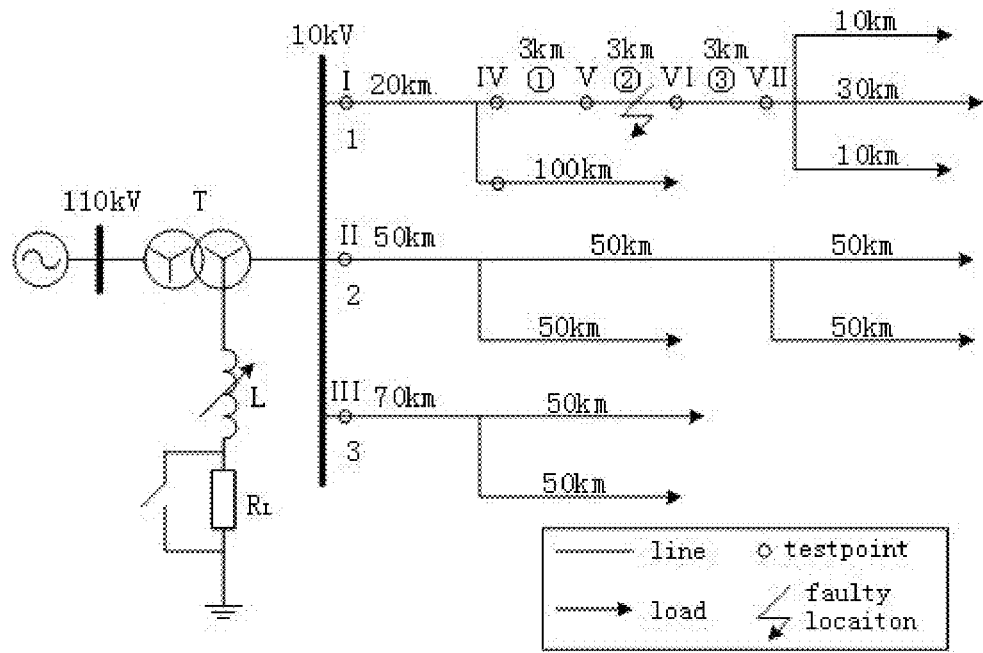
FIG. 2 is a simulation diagram for a 10 kV system.

According to the fault location method provided by the present invention, different types of faults are set in the simulated 10 kV distribution network system. The structure of the system as shown in FIG. 2 shows that the busbar has three back lines numbered as line 1, 2 and 3; ①, ② and ③ are section numbers; detection points are numbered with Roman numerals; fault is set at section ②. Sampling frequency is set at 20 kHz (400 points in 1 cycle); fault occurrence time is 0.3s; action time of the arc suppression device in case of grounding fault is set as 0.04s; and the threshold value for the standard deviation is set as 3.

EXAMPLE 1

Detection and Location of the Inter-Phase Fault

In the example having an inter-phase fault, the method of the present invention provides that Step 1 (S1): the three-phase current and zero-sequence voltage of the busbar are monitored, an over-current to the busbar appears while the zero-sequence voltage is zero, where the over-current to phases A and B occurs and a current variation at 0.3s occurs; therefore, an AB inter-phase fault occurring at 0.3s is determined.

Figure 3:
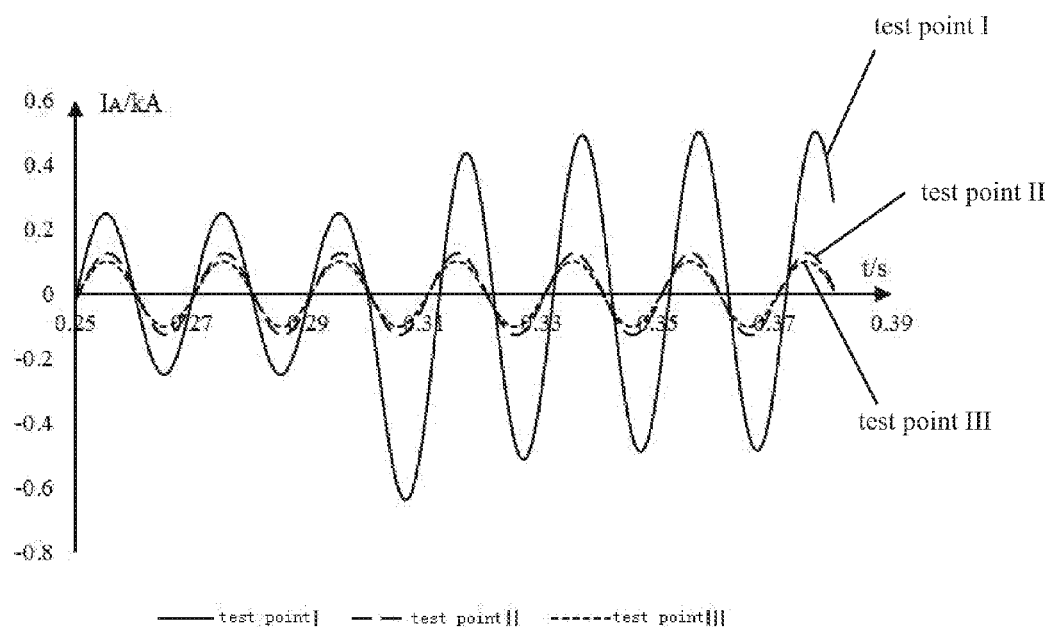
FIG. 3 shows a fault-phase current waveform at the initial end of the inter-phase short-circuit line.

Step 2 (S2): fault-phase current to the detection points I, II and III are measured at the initial end of the three lines. As shown in FIG. 3, an over-current obviously occurs on the fault-phase current at the initial end of line 1, exceeding the preset value, while the fault-phase current to the initial ends of lines 2 and 3 remains unchanged. Therefore, line 1 is determined to be faulty.

Figure 4:
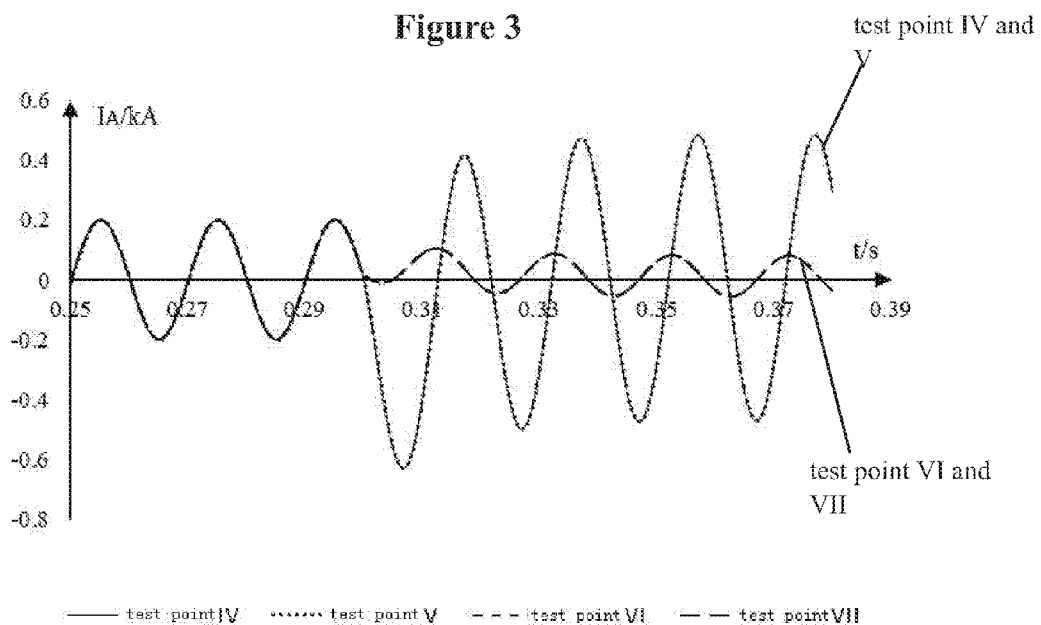
FIG. 4 shows a fault-phase current waveform along inter-phase short-circuit line 1.

Step 3 (S3): fault-phase current at detection points IV, V, VI and VII are measured along line 1 as shown in FIG. 4; the standard deviation at section ①, ② and ③ are calculated according to the formula. The results are shown in Table 1: the standard deviation to section ② is over 3, and thus section ② is determined to be faulty.

TABLE 1

Simulation Results of Inter-Phase Fault.

| Fault type | Line selection result | Standard deviation ① | ② | ③ | Location result |
|---|---|---|---|---|---|
| AB inter-phase | Over-current to line 1 | 9.9840E−5 | 6.7268 | 3.1274E−4 | ② |
| ABC three-phase | | 6.3319E−5 | 8.3460 | 1.3835E−4 | ② |

EXAMPLE 2

Detection and Location of the Grounding Fault

In the example of having a grounding fault, the method of the present invention provides that:

Step 1 (S1): three-phase current and zero-sequence voltage to the busbar are monitored, the zero-sequence voltage exceeds the phase voltage by 10% while there is no over current on the three-phase current to the busbar; zero-sequence voltage at 0.3s has a sudden change, thus, a grounding fault is determined at the moment of 0.3s.

Figure 5:
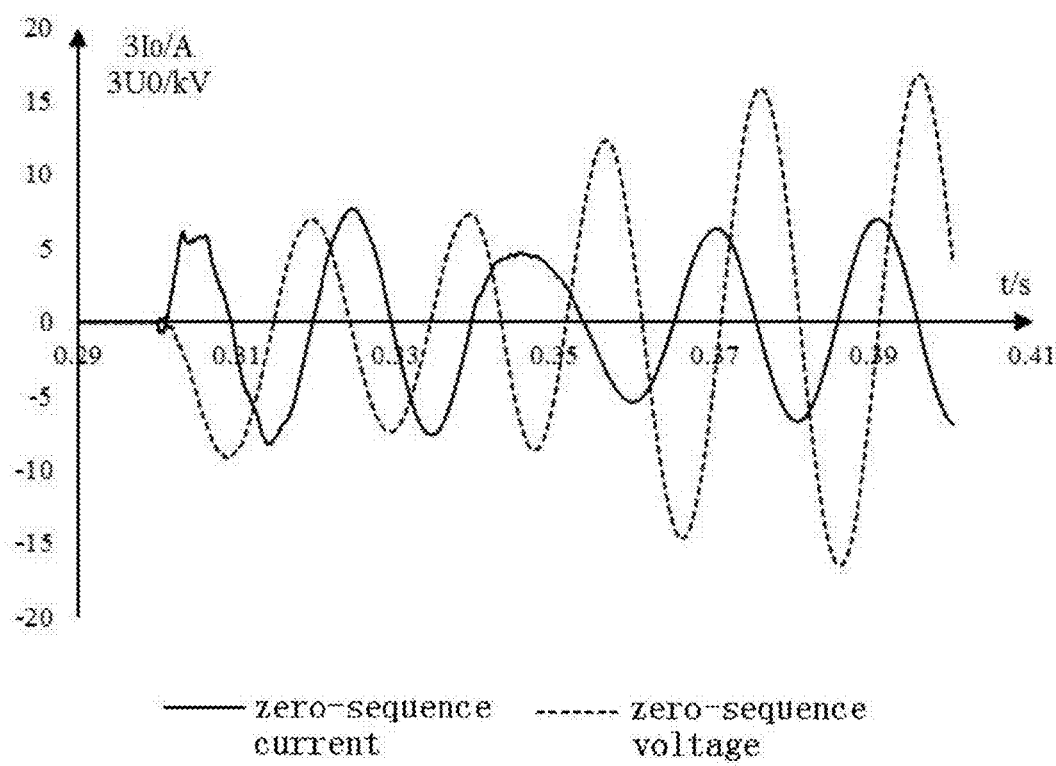
FIG. 5 shows the zero-sequence voltage and zero-sequence current waveform at the initial end of the faulty line in case of a grounding fault.
Figure 6:
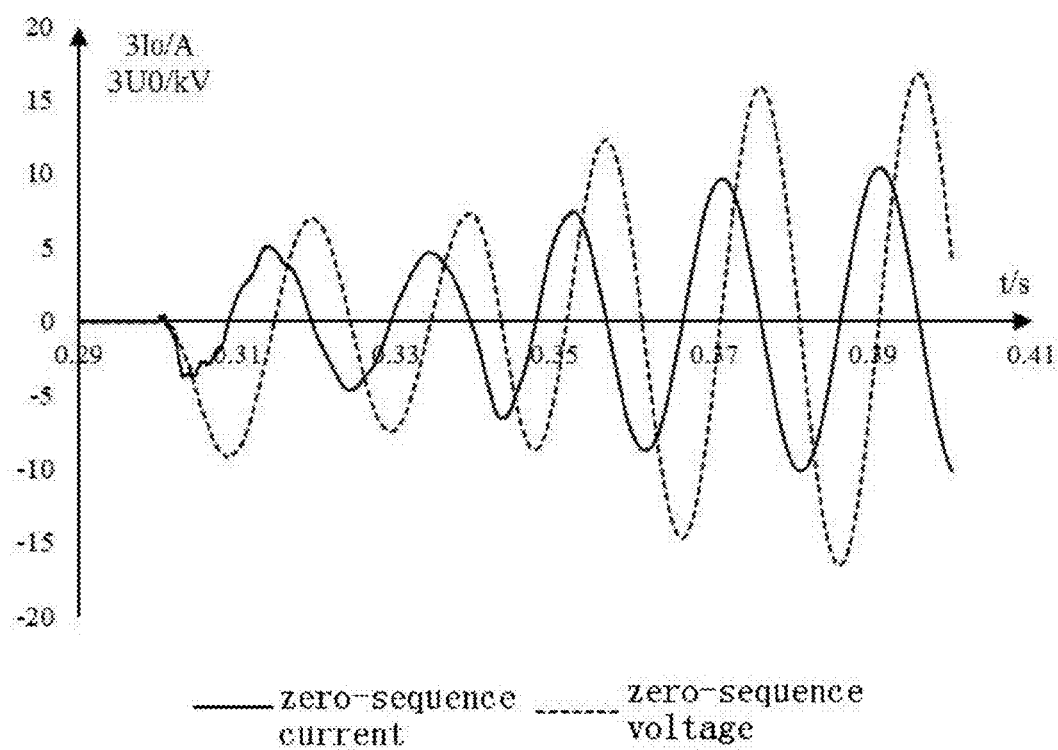
FIG. 6 shows the zero-sequence voltage and zero-sequence current waveform at the initial end of a non-faulty line in case of a grounding fault.

Step 2 (S2): zero-sequence current and zero-sequence voltage at detection points I, II and III at the initial ends of the three lines are measured. As shown in FIGS. 5 and 6, the maximum values of the cross correlation function of the zero-sequence current and zero-sequence voltage at the three detection points are calculated, which are the time delays of the zero-sequence current corresponding to the zero-sequence voltage. As shown in Table 2., the maximum value of the cross correlation function of the initial end of line 1 exceeds the half cycle, i.e., the zero-sequence current lags behind the zero-sequence voltage, while the maximum values of the cross correlation function of the initial ends of lines 2 and 3 are below the half cycle. Thus, line 1 is determined to be faulty.

Figure 7:
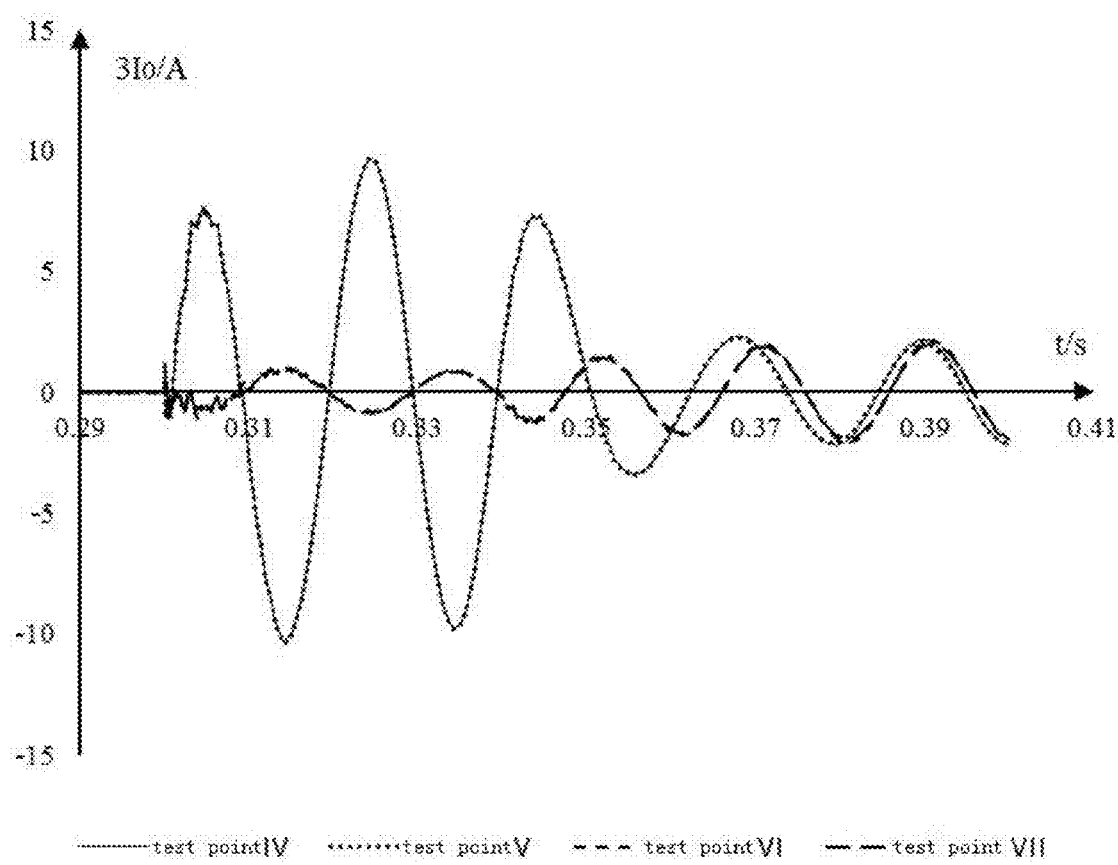
FIG. 7 shows the zero-sequence current waveform along a grounding faulty line 1.

Step 3 (S3): fault-phase current at detection points IV, V, VI and VII along line 1 are measured as shown in FIG. 7; standard deviations at section ①, ②, and ③ are calculated according to the formula and results are shown in Table 2. The standard deviation at section ② is over 3, thus, section ② is determined to be faulty.

TABLE 2

Simulation Results of Single-Phase Grounding Fault.

| Arc suppression coil type | Fault transition resistance | $T_1$ time interval Time delay (point) of $U_0$ corresponding to $I_0$ | | | Line selection result | Standard deviation | | | Location result |
|---|---|---|---|---|---|---|---|---|---|
| | | 1 | 2 | 3 | | ① | ② | ③ | |
| Preset | 100Ω | 309 | 85 | 84 | 1 | 0.0056 | 11.1430 | 0.0601 | ② |
| | 500Ω | 309 | 89 | 89 | 1 | 0.0069 | 9.2385 | 0.0604 | ② |
| | 1 kΩ | 309 | 89 | 89 | 1 | 0.0071 | 8.9771 | 0.0608 | ② |
| | 2 kΩ | 309 | 87 | 112 | 1 | 0.0071 | 9.0845 | 0.0615 | ② |
| Random | 100Ω | 310 | 86 | 85 | 1 | 0.0063 | 9.9320 | 0.0601 | ② |
| | 500Ω | 311 | 96 | 96 | 1 | 0.0079 | 8.1268 | 0.0603 | ② |
| | 1 kΩ | 311 | 101 | 101 | 1 | 0.0082 | 7.8480 | 0.0606 | ② |
| | 2 kΩ | 310 | 103 | 103 | 1 | 0.0085 | 7.6261 | 0.0611 | ② |

We claim:

1. A method for locating a faulty section on a line in an electrical power distribution network having multiple measurement points along each line and protected by protection devices, comprising:
    measuring a three-phase current and a zero-sequence voltage on a busbar in an electrical power distribution network where a fault has occurred at a section on a line,
    determining a type, phase, and time of the fault based on the three-phase current and zero-sequence voltage being measured,
    measuring the three-phase current or a zero-sequence current and a zero-sequence voltage at initial ends of each line in the electrical power distribution network during a time period from occurrence of the fault to action by the protection device,
    determining a faulty line that has the faulty section thereon based on the type of the fault and the three-phase current or the zero-sequence current and the zero-sequence voltage at initial ends of each line being measured,
    measuring a current at each of measurement points along the faulty line, and
    locating the faulty section on the faulty line by the current at each of the measurement points along the faulty line, wherein the protection device is a relay protection device or an arc suppression coil;

when the type of the fault is determined to be an inter-phase fault, the three-phase current at the initial ends of each line during the time period from the occurrence of the fault to the action of the relay protection device are measured to determine the faulty line, and a fault-phase current at each measurement points along the faulty line are measured to locate the faulty section; and when the type of the fault is determined to be a grounding fault, the zero-sequence current and the zero-sequence voltage at the initial ends of each line during the time period from the occurrence of the fault to action of the arc suppression coil are measured to determine the faulty lire, and zero-sequence current at each measurement points along the faulty line are measured to locate the faulty section.

2. The method as claimed in claim 1, further comprising detecting an over-current on the three-phase current on the busbar and determining the type of the fault to be an inter-phase fault;

obtaining the phase of the fault; and determining the time of the fault to be a time period that the three-phase current is detected to the action of the relay protection device.

3. The method as claimed in claim 2, further comprising detecting the over-current on the three-phase current on a line on the busbar, and determining that the line having the over-current is the faulty line.

4. The method as claimed in claim 3, further comprising collecting a fault-phase current of each of the measurement points along the faulty line as characteristic current, calculating a standard deviation $d_{p.u.}$ of formula (7) based on the characteristic current of each of the measurement points along the faulty line:

$$d_{p.u.} = \left[\frac{\sum_{n=1}^{M}[i_{01}(n)-i_{02}(n)]^2}{\min\left\{\sum_{n=1}^{M}i_{01}(n)^2, \sum_{n=1}^{M}i_{02}(n)^2\right\}}\right]^{\frac{1}{2}} \quad (7)$$

wherein $i_{01}(n)$ and $i_{02}(n)$ are sequences of the characteristic current as collected at the two adjacent measurement points along the faulty line; n is a sampling sequence, and M is a data length, determining that a section between the two adjacent points is not a faulty section when the standard deviation is near zero and determining that a section between the two adjacent points is a faulty section when the standard deviation exceed a threshold value.

5. The method as claimed in claim 4, wherein the threshold value is from 1 to 3.

6. The method as claimed in claim 4, wherein data of the current is collected in two cycles.

7. The method as claimed in claim 6, wherein each of the two cycles is taken on the same length of time, and calculation of $d_{p.u.}$ is repeated for 3 to 5 times.

8. The method as claimed in claim 1, further comprising detecting no over-current on the three-phase current on the busbar and detecting no increase in the zero-sequence voltage, and determining that all lines work and the busbar is faulty.

9. The method as claimed in claim 1, further comprising detecting an increase in the zero-sequence voltage on the busbar and determining the type of the fault to be a grounding fault; and determining the time of the grounding fault to be a time period the increase in the zero-sequence voltage detected to the action of the arc suppression coil.

10. The method as claimed in claim 9, further comprising collecting a sampling sequence of the zero-sequence voltage $U_0(m)$ and the zero-sequence current $I_0(m)$ at the initial ends of each line during the time period of the grounding fault, calculating a maximum value $R_{ui}(\tau)$ of a cross correlation function of formula (6):

$$R_{ui}(m) = \sum_{i=0}^{N-m-1} I_0(i)U_0(i+m) \quad (6)$$

wherein R(m) is a similarity of the zero-sequence voltage and the zero-sequence current at different relative positions, m is an integer from 0 to N−1, N is a frequency of the sampling, $\tau$ is to time delay of $I_0(m)$ in correspondence with $U_0(m)$, determining that a line having a $\tau$ between N/2 and N is the faulty line.

11. The method as claimed in claim 10, further comprising collecting the zero-sequence current of each of the measurementpoints along the faulty line as characteristic current, calculating a standard deviation $d_{p.u.}$ of formula (7) based on the characteristic current, $$d_{p.u.} = \left[\frac{\sum_{n=1}^{M}[i_{01}(n)-i_{02}(n)]^2}{\min\left\{\sum_{n=1}^{M}i_{01}(n)^2, \sum_{n=1}^{M}i_{02}(n)^2\right\}}\right]^{\frac{1}{2}} \quad (7)$$

wherein $i_{01}(n)$ and $i_{02}(n)$ are sequences of the characteristic current as collected at the two adjacent measurement points along the faulty line; n is a sampling sequence, and M is a data length, determining that a section between the two adjacent measurement points is not a faulty section when the standard deviation is near zero and determining that the section between the two adjacent measurement points is a faulty section when the standard deviation exceed a threshold value.

12. The method as claimed in claim 11, wherein the threshold value is from 1 to 3.

13. The method as claimed in claim 11, wherein data of the current is collected in two cycles.

14. The method as claimed in claim 13, wherein each of the two cycles is taken on the same length of time, and calculation of $d_{p.u.}$ is repeated for 3 to 5 times.

* * * * *